US006696870B2

(12) United States Patent
Dellow

(10) Patent No.: US 6,696,870 B2
(45) Date of Patent: Feb. 24, 2004

(54) PHASE CONTROL DIGITAL FREQUENCY DIVIDER

(75) Inventor: Andrew Dellow, Almondbury (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 10/104,994

(22) Filed: Mar. 22, 2002

(65) Prior Publication Data

US 2002/0171459 A1 Nov. 21, 2002

(30) Foreign Application Priority Data

Mar. 23, 2001 (EP) .......................................... 01302735

(51) Int. Cl.[7] ............................................. H03K 21/00
(52) U.S. Cl. ......................... 327/115; 327/117; 377/48
(58) Field of Search ................................ 327/115, 117; 377/47, 48

(56) References Cited

U.S. PATENT DOCUMENTS 3,725,791 A * 4/1973 Moreau et al. ............. 327/115
4,560,960 A * 12/1985 Chanrion ................... 331/178
5,052,031 A * 9/1991 Molloy ...................... 327/117
5,150,390 A * 9/1992 Hayashi et al. ............. 377/116
5,889,436 A    3/1999 Yeung et al. .................. 331/2
5,970,110 A   10/1999 Li ............................... 377/48
6,114,914 A    9/2000 Mar ............................ 331/16

FOREIGN PATENT DOCUMENTS

JP          01-120810          5/1989

* cited by examiner

Primary Examiner—Kenneth B. Wells
(74) Attorney, Agent, or Firm—Lisa K. Jorganson; Robert Iannucci; Seed IP Law Group PLLC

(57) ABSTRACT

A digital frequency divider includes phase control of the output signal in increments of whole or half cycles of the input frequency. Whole cycle phase control is achieved by varying (logically or physically) the tap off point of a shift register loaded with a bit pattern for appropriate division. Half cycle phase changes are achieved by a multiplexer selecting one of two signals every half cycle.

29 Claims, 16 Drawing Sheets

| NODE | INPUT=0 | INPUT=1 | INPUT=0 | INPUT=1 |
|------|---------|---------|---------|---------|
| A | 0 | 0 | 0 | 1 |
| B | 0 | 1 | 1 | 1 |
| C | 0 | 0 | 0 | 1 |
| D | 0 | 1 | 1 | 1 |
| E | 0 | 1 | 1 | 0 |
| F | 0 | 0 | 0 | 0 |
| G | 0 | 1 | 1 | 0 |
| H | 0 | 0 | 1 | 1 |
| HNEXT | 0 | 1 | 1 | 0 |

TABLE 2

PHASE CONTROL DIGITAL FREQUENCY DIVIDER

BACKGROUND OF THE INVENTION

1. Field of the Invention

The present invention relates to a digital frequency divider with a phase control, and in particular to a frequency divider with a shift register.

2. Description of the Related Art

In digital systems, integrated circuits (ICs) or chips are operated by pulses from a clock. In systems such as television receivers or decrypters, there can be many different chips each operating at a different clock frequency. The different regions operating at different frequencies are referred to as "clock domains". For example, one chip may operate as a master chip in a 166 MHz domain, with another store chip in a 133 MHz domain. In this situation, there is a need for two clock frequencies.

One solution to the problem of providing different clock frequencies is to use a master frequency and produce the frequency for the store chip by dividing the master clock frequency.

BRIEF SUMMARY OF THE INVENTION

We have appreciated that the frequency division should introduce a minimum noise into the clocking signal, and involve efficient use of circuitry. We have also appreciated that it would be useful to control the phase of a divided clock frequency. One known way of changing clock phase relative to one another is to use a delay line. However, we have appreciated that the maximum delays achievable with delay lines are small, and that they are prone to noise.

Accordingly, there is provided a digital frequency divider for dividing a clock frequency and having a variable phase output comprising:

a shift register for storing a bit sequence chosen according to a division factor and operating under control of a clock signal at a first frequency;

tap off circuitry arranged to tap the shift register at one or more variable points and arranged to produce two or more signals representative of the bit sequence;

control logic circuitry having at least two inputs arranged to receive the two or more signals representative of the bit sequence and arranged to provide at least two output signals; and a multiplexer arranged to receive the two output signals and to select one of the output signals in turn under control of the clock signal at the first frequency to thereby produce a clock output signal at a second frequency being a division of the first frequency;

wherein the tap off circuitry and shift register are arranged such that the one or more tap off points of the shift register are variable in position along the bit sequence such that the clock output signal is variable in phase.

The combining of phase control with the circuitry of a frequency divider is an efficient use of circuitry. Moreover, the phase control is wholly digital and allows infinite delay, both positive and negative, in either direction.

BRIEF DESCRIPTION OF THE SEVERAL VIEWS OF THE DRAWINGS

An embodiment of the invention will now be described, by way of example only, in which.

DETAILED DESCRIPTION OF THE INVENTION

An embodiment of the invention comprises a frequency divider using a single shift register to perform division and additional components to control the phase of the output. The phase control is combined with the frequency divider itself resulting in an efficient use of circuitry. A digital frequency divider without phase control will first be described for ease of understanding with reference to FIGS. 1 to 9, followed by a description of a divider with phase control.

Figure 1:
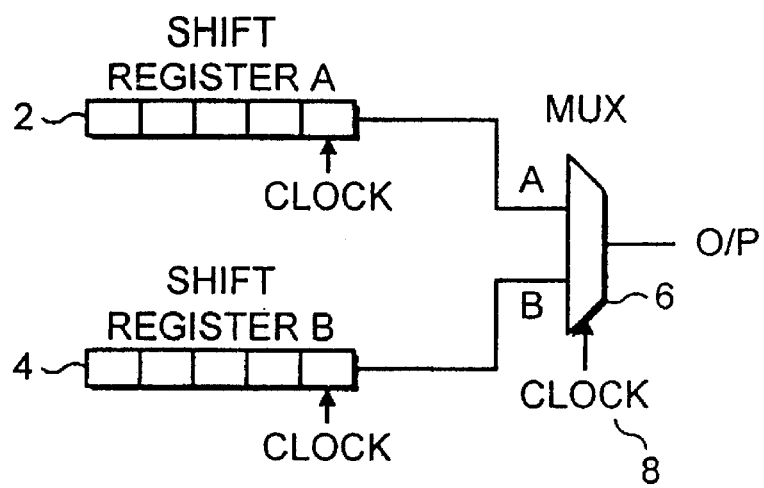
FIG. 1: shows two shift register digital frequency divider.

A two shift register frequency divider is shown in FIG. 1, and comprises two variable length shift registers 2,4 each providing an input to a multiplexer (MUX) 6 arranged such that the output (o/p) from the multiplexer is alternately equal to the output from the first shift register (A), then the second shift register (B). The shift registers and the multiplexer are activated by a digital clock signal 8. Although not shown, the shift registers are in fact rotatable so that the output is rotated back to the input whereby the contents of the register are rotated with each bit in turn presented at the output. The shift registers are arranged to progress on a change in the clock from low to high, whereas the multiplexer is simply level sensitive. The multiplexer thus selects Register A when the clock is high and Register B when the clock is low.

Figure 2:
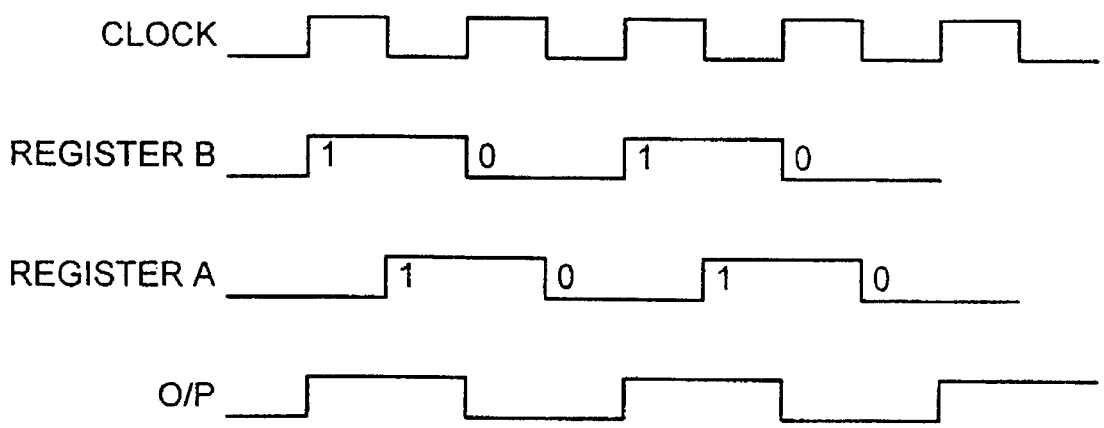
FIG. 2: shows sequences for the two shift register divider for various divisions.

The output signal o/p is a division of the clock signal depending on the length and arrangement of bits in the shift register. The arrangement of bits in the registers for a simple division by two is shown in FIG. 2. As can be seen, the contents of each register are a simple sequence of repeating (10101010 . . . . ). In fact, a shift register containing the sequence (1010) may be used and rotated in a continuous loop.

Figure 3:
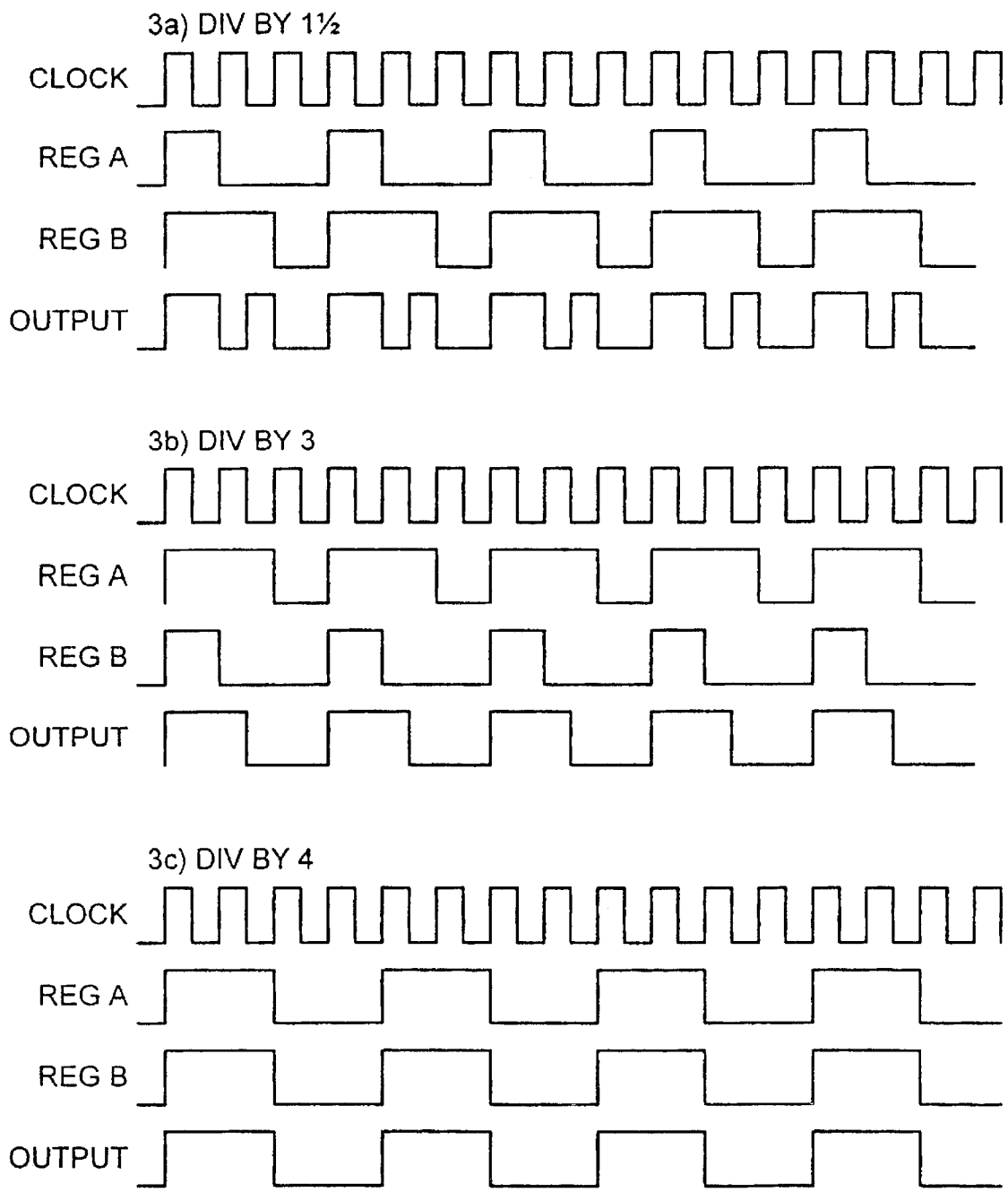
FIG. 3: shows sequences for division by various other factors.

The two shift register divider works for other divisions, as shown in FIG. 3. In FIG. 3(a) division by a factor of 1½ is shown. The smallest units for each register are:

| Register A | 1 | 0 | 0 |
| --- | --- | --- | --- |
| Register B | 1 | 1 | 0 |

Similarly FIG. 3(b) shows division 3 with the following registers:

| Register A | 1 | 1 | 0 |
| --- | --- | --- | --- |
| Register B | 1 | 0 | 0 |

Lastly, FIG. 3(c) shows division by 4 with registers as follows:

| Register A | 1 | 1 | 0 | 0 |
| --- | --- | --- | --- | --- |
| Register B | 1 | 1 | 0 | 0 |

It will be noted that the ratio between highs and lows (the mark-space ratio) for division by half integer numbers is uneven, but over two or more cycles produces a high state and low state for equal durations. For even or odd integer division the mark-space ratio is even. To allow for differing high/low sequences for different divisions, the shift registers are variable length. As can be seen, the higher the division factor, the longer the shift register needs to be.

Figure 4:
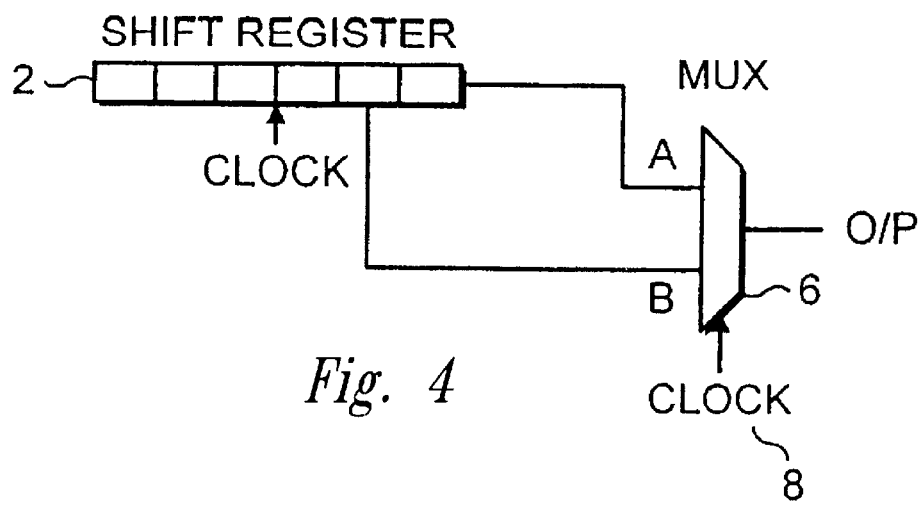
FIG. 4: shows a single shift register digital frequency divider.
Figure 5:
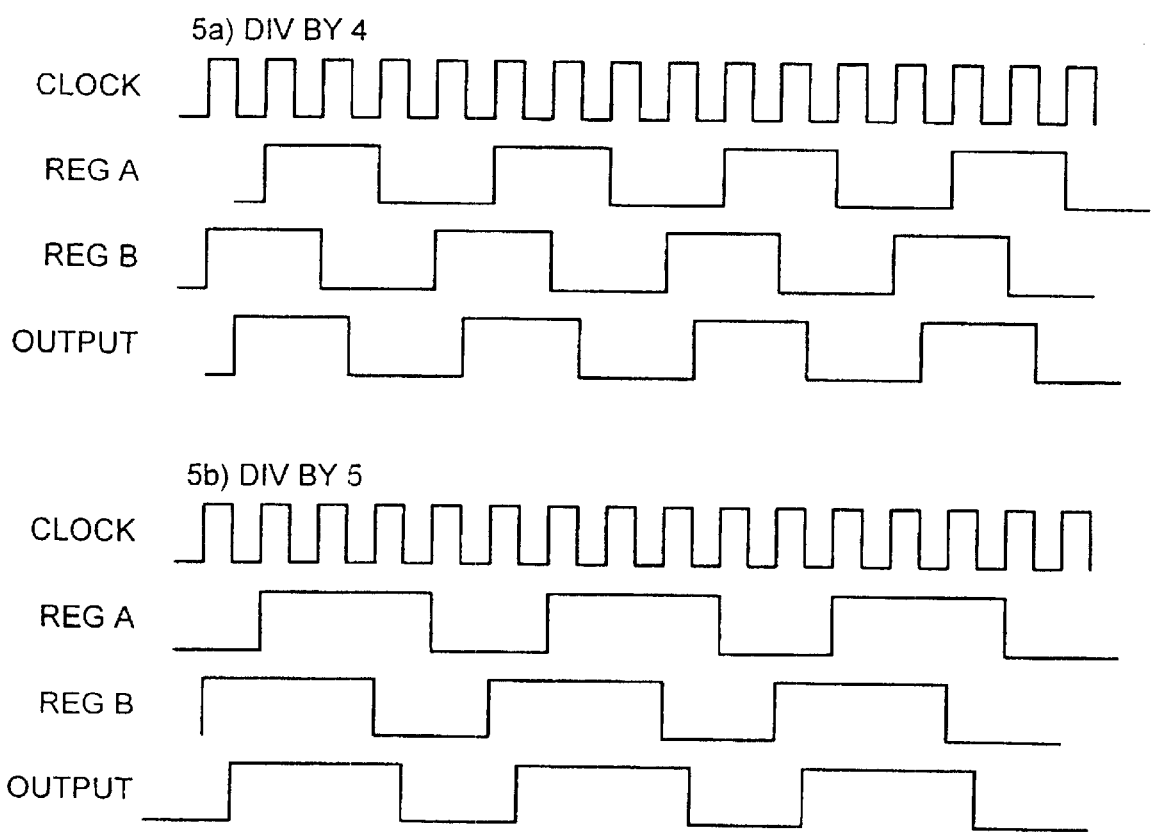
FIG. 5: shows various register sequences for the single shift register frequency divider of FIG. 4.

An arrangement with a single shift register is shown in FIG. 4. As before, a multiplexer 6 selects either input A or B alternately under control of a clock 8. A single shifter register 2 now provides the input to both the A and B inputs of the MUX 6, with the A input being tapped from the shift register at a point one bit from the end so that input A is an historical version in input B. This arrangement can also be used to divide by integer divisions. As shown in FIG. 5, inter divisions are achieved with the register loaded as follows.

For division by 4, as shown in FIG. 5(a) the shift register stores:

| Register | 1 | 1 | 0 | 0 |
| --- | --- | --- | --- | --- |

For division by 5, as shown in FIG. 5(b) the shift register stores:

| Register | 1 | 1 | 1 | 0 | 0 |
| --- | --- | --- | --- | --- | --- |

However, for division by 5, the mark-space ratio is now uneven with a ratio of 5:4. Moreover, over many cycles, the high state is present more than the low state. Such an uneven mark-space ratio could cause noise and power problems, and so is not preferred.

A single shift register as shown in FIG. 4 cannot divide by a half integer factor. This is because division by a half integer requires the inputs on A and B to have a different sequence, whereas a single shift register in the arrangement shown can only ever produce the same sequence on A as on B, because each bit is presented first on B then on A.

Figure 6:
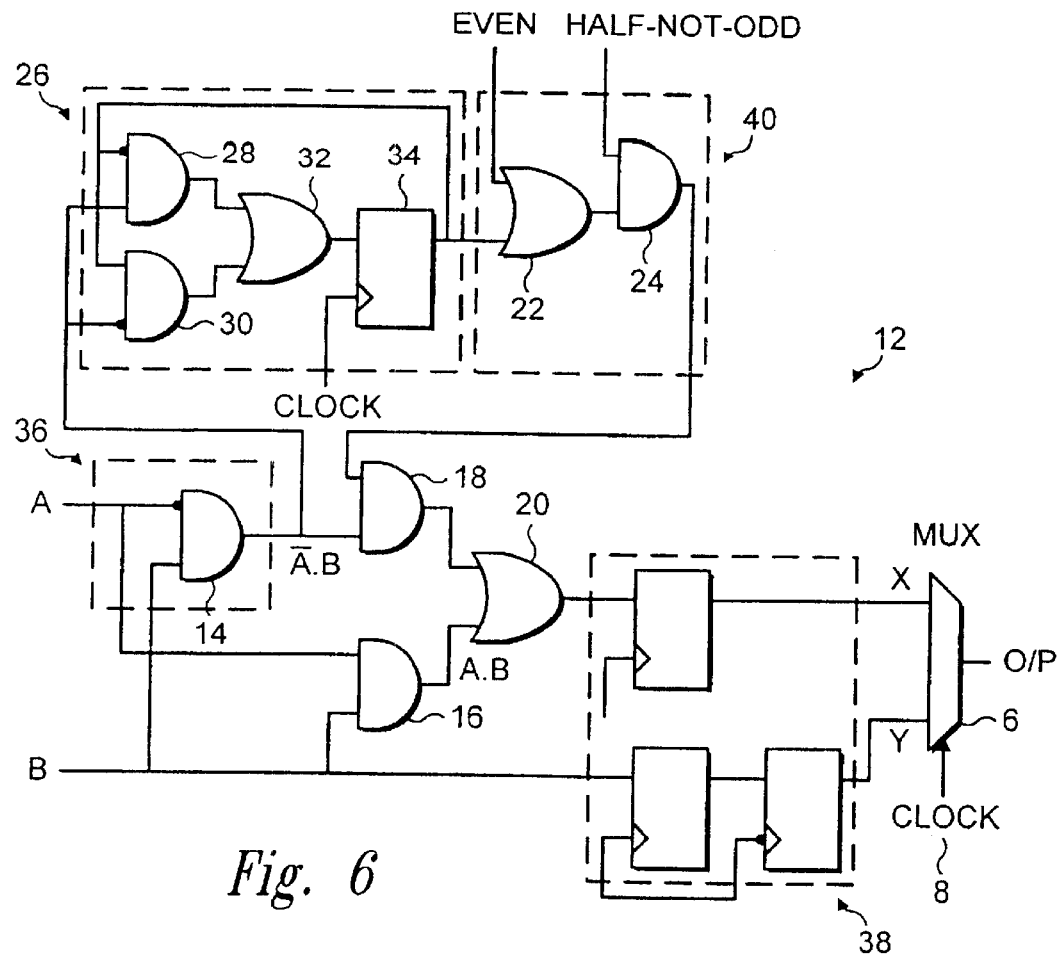
FIG. 6: shows control logic circuitry.
Figure 7:
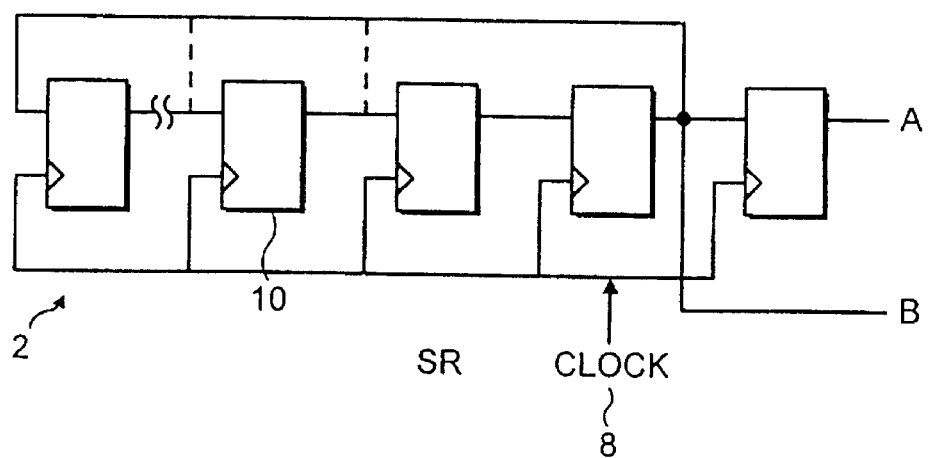
FIG. 7: shows a shift register.

A single shift register digital divider arrangement embodying the invention and which can divide by half integers and produce a repeatable mark-space ratio is shown in FIG. 6. Like components retain the same reference numbers as before. A multiplexer 6 is clocked by a clocking signal 8 which is also provided to a shift register 2 (FIG. 7) comprising a sequence of D-type flip flops which can be set and reset by SR control signals. The register is effectively variable in length by selecting the number of D-type flip flops activated and the loop point.

Inputs A and B are thus from a single shift register as before. Input B passes direct to the multiplexer 6 via two D-type flip flops (for timing purposes described later) whereas input A passes through additional control logic circuitry 12 which provides additional functionality to detect low to high changes in input A and to use this additional information to allow odd and half integer division.

In broad terms, the control logic circuitry 12 comprises an edge detector 36 in the form of AND gate 14 for detecting changes in the bit sequence from the shift register from 0 to 1, a toggle or latch circuit 26, program logic circuit 40, timing circuitry and gates for providing inputs to the multiplexer 6. The edge detector provides a signal to the toggle circuit 26 which toggles to indicate the last status thereof. The program logic circuit 40 receives two inputs to allow the remaining gates to be configured, depending on whether odd, even or half integer division is to be performed.

The control logic circuitry 12 is arranged as follows. A first AND gate 14 with an inverted input produces an output ($\bar{A}$.B). A second AND gate 16 produces an output (A.B). With the additional knowledge that A is a historical version of B shifted by one bit, we know that:

($\bar{A}$.B)=1 if A=0 and B=1, i.e. a rising edge is detected in the shift register sequence.

Similarly, we know that:

(A.B)=1 if A=1 and B=1, i.e. the sequence is not a rising or falling edge.

This information in itself would be sufficient to perform odd integer division by configuring the circuit to always remove the first half clock cycle of sequence data from the output. This would make the mark-space ratio 4.5:4.5 rather than 5:4 that we had before. However, if this were done, then even division would have an irregular mark-space ratio. Further, division by half integers would not operate correctly. Accordingly, in addition to detecting low to high changes, the control logic circuitry determines alternate low to high changes to allow removal of the first half clock cycle of sequence data on alternate periods. This configurability is provided by a function in the circuit 12 to detect the rising edge indication and a function to select deletion of bits depending on whether the division is even, odd or half integer.

The selection of whether or not the input A is presented at the output is achieved by the third AND gate 18 under control of the toggle and control circuitry. In the event that the input to AND gate 8 is 1, then the output is simply the input namely ($\bar{A}$.B). In this case the input to selecting OR gate 20 is ($\bar{A}$.B) on one input and (A.B) on the other. The output of selecting OR gate 20 is therefore:

($\bar{A}$.B)+(A.B)

which is=B.

The output is thus B on both channels X and Y to the multiplexer 6. The output of the multiplexer is simply B and so the pattern of digits in the shift register is simply chosen for the appropriate division e.g. (1100 1100) for divide by four as shown in FIG. 8(a). All other even divisions follow the same pattern.

The example given above for even division has the input of AND gate 18 as 1 so that the output follows the input with the result that the input to the multiplexer 6 is B on both X and Y inputs. The setting of AND gate 18 to have one input as 1 (or 0) is achieved by selection functionality provided by control logic OR gate 22 and control logic AND gate 24 with respective inputs labelled "EVEN" and "HALF-NOT-ODD". These inputs are set according to the following control logic:

TABLE 1

| EVEN | HALF-NOT-ODD | FUNCTION |
|---|---|---|
| X | 0 | Divide odd whole number (e.g. divide 5) |
| 0 | 1 | Divide half ratio (e.g. divide 3.5) |
| 1 | 1 | Divide even whole number (e.g. divide 6) |

As can be seen, when dividing by an even whole number, the input to OR gate 22 is 1 and so the output is necessarily 1. The inputs to AND gate 24 are both 1 and so the output is 1 so that AND gate 18 is effectively ignored (becomes an input follower) providing the output $(\overline{A}.B)+(A.B)=B$ from OR gate 20 as described above.

Figure 8:
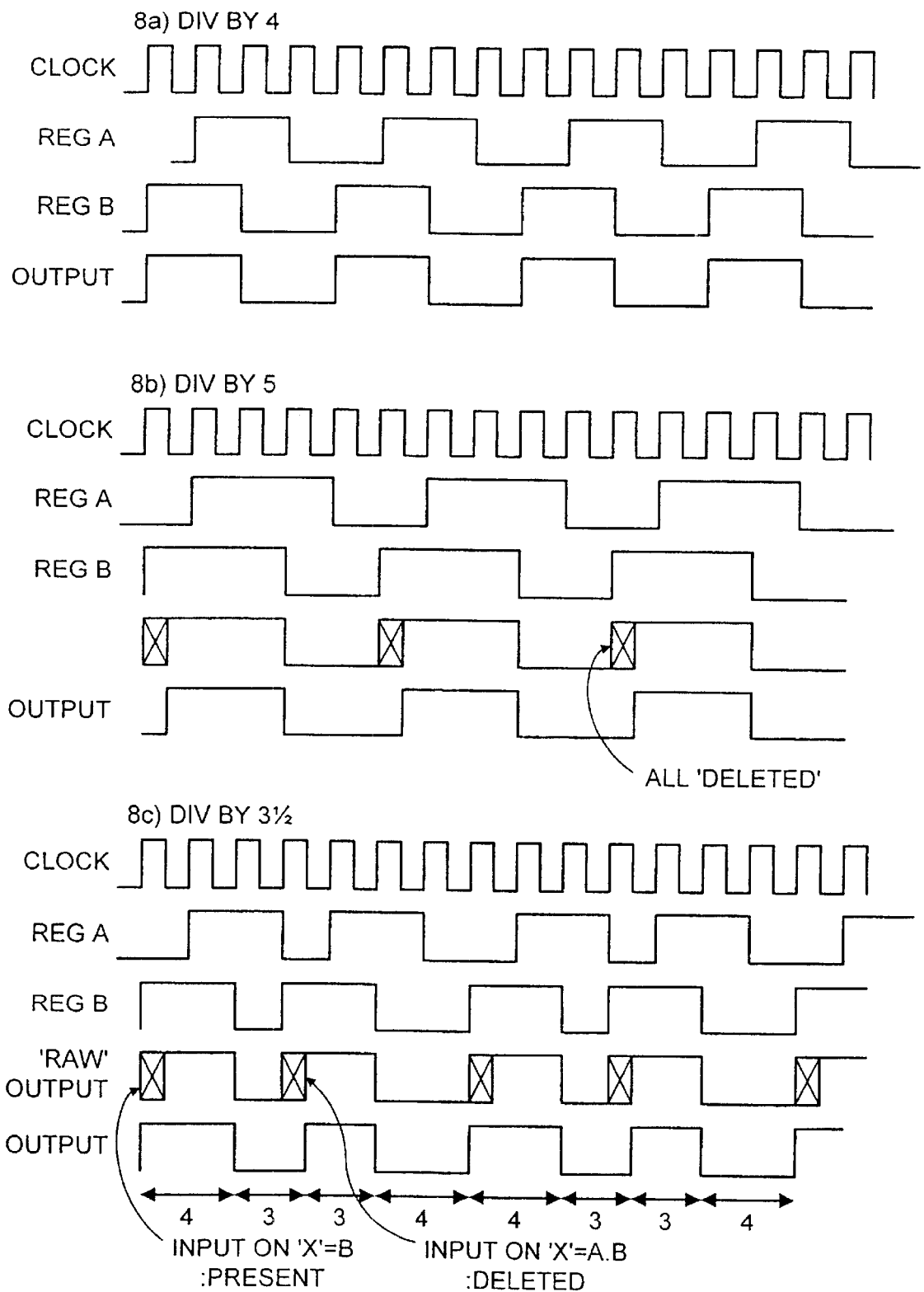
FIG. 8: shows various register sequences for the shift register and control circuitry of FIGS. 6 and 7.

As can also be seen, with the input of HALF-NOT-ODD as zero to AND gate 24, the output AND gate 24 is also zero, further setting the output of AND gate 18 to zero with the result that selecting OR gate 20 becomes an input follower with an output (A.B). The inputs to the multiplexer are B and (A.B) with the result as shown in FIG. 8(*b*) for division by 5; an even mark-space ratio is provided. Effectively, the first half clock cycle at each change from 0 to 1 is "deleted" in the sense that the input to the multiplexer is zero. This is because (A.B)=0 whenever there is a change for 0 to 1 in the bit sequence, because B=1 and A=0. The pattern in the shift register is (11100) and all other odd divisions follow the same patterning (1111000) for division by 7.

The case for division by half ratios involves toggle circuitry 26 as can now be seen. With control logic inputs EVEN=0 and HALF-NOT-ODD=1, both OR gate 22 and AND gate 24 become input followers so that the output of toggle circuit 26 is presented to AND gate 18. Following this through, the output of AND gate 18 is either 0 or $(\overline{A}.B)$ with the result that one of two possible outputs from OR gate 20 are given:

(1) A.B (if D-type flip flop output=0)
(2) $(\overline{A}.B)+(A.B)=B$ (if D-type flip flop output=1)

The output given depends on the status of the D-type flip flop circuitry as now will be described.

The toggle circuitry 26 comprises two AND gates 28, 30 with on inverting input, an OR gate 32 and a D-type flip-flop 34. The toggle itself receives a single input: $(\overline{A}.B)$. The D-type 34 feeds its input back to the AND gates 28, 30 when A=0, the input to the D-type is necessarily 0. When the output of the D-type is zero, but A=1, then AND gate 28 produces output=1 so the input to the D-type=1. Thus, a change in sequence from A=0 to A=1 is sampled and produces a D-type flip flop output=1. Thus, when the sequence of bits in the register changes from 0 to 1, the input to the multiplexer on X is B, otherwise, the input is (A.B). The D-type flip flop toggles every time a change in the sequence from 0 to 1 is detected so that the output is alternately 0 and 1 at changes in the bit sequence, and the input to the multiplexer an X is alternately (A.B) and B. As a result, as shown in FIG. 8(*c*), alternate portions of the first half cycle of the output shown as "X" are effectively "deleted" in the sense that without toggle operation, the output would simply be B and the output would be 1.

The mark-space ratio for half division is not exactly equal (as shown) with a ratio of 3:4, but over two cycles is "even" in the sense that the output is high for as long as it is low. As previously noted, this can be important for power considerations.

Figure 9:
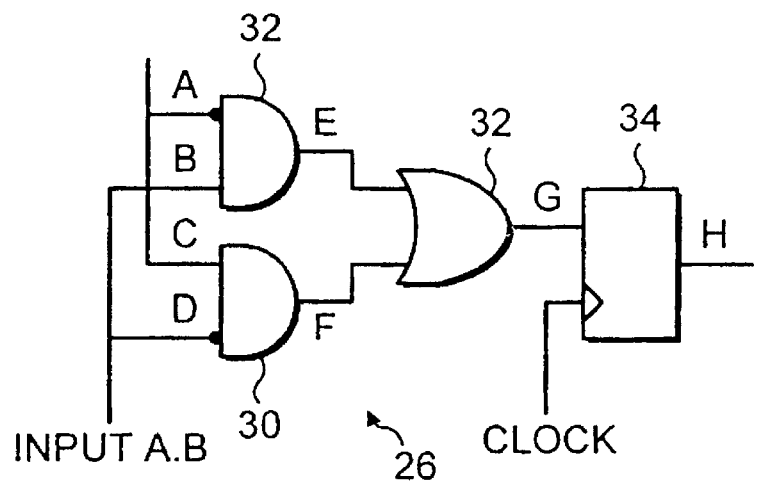
FIG. 9: shows latch circuitry and its table of status.

The toggling operation can be understood more fully by referring to FIG. 9. The high/low status at points A to H are labelled and noted at Table 2. The reference HNEXT is the status at H after the next clock cycle. As can be seen, the output H goes to 1 when the input is 1, and stays at 1 until the input is next 1 when it goes to zero. Effectively, the whole circuit toggles from 1 to 0 and 0 to 1 alternately when the input is 1. Now since the input is $((\overline{A}.B)$ which, as previously described, is only high when a change in the bit register sequence from 0 to 1 is detected, the D-type flip flop circuit toggles from 0 to 1 and 1 to 0 when changes in the bit sequence from 0 to 1 are detected. As a result, alternate "edges" in the output are effectively "deleted" as previously shown and described in relation to FIG. 8(*c*).

In summary, the digital divider includes elements which perform the following logical functions:

(1) a change in the register bit sequence from 0 to 1 is detected (known as a "positive edge");
(2) positive edges selected; and
(3) positive edges for first half clock cycle "deleted" in the sense that the output to the multiplexer is 0. Alternatively, an embodiment could be chosen that operated the logic circuit on the negative edges. The choice is a matter of design preference.

The functions are provided (referring again to FIG. 6) by the AND gate 14 functioning as an edge detector, D-type flip flop circuitry 26 functioning as an alternate edge selector, control logic to allow the circuit to be programmed according to the appropriate division and a "deleter" to make the output 0 at selected edges.

The timing circuitry 38 comprises 3 D-type flip flops arranged with one in the X channel and one in the Y channel. This is to compensate the timing which is delayed by the D-type flip flop 34 and other components.

Clearly, other arrangements of gates and other components such as Boolean equivalents of those described may be used and are within the scope of the invention. In particular, the symbols 0 and 1 could simply be reversed throughout by use of inverters.

Figure 10:
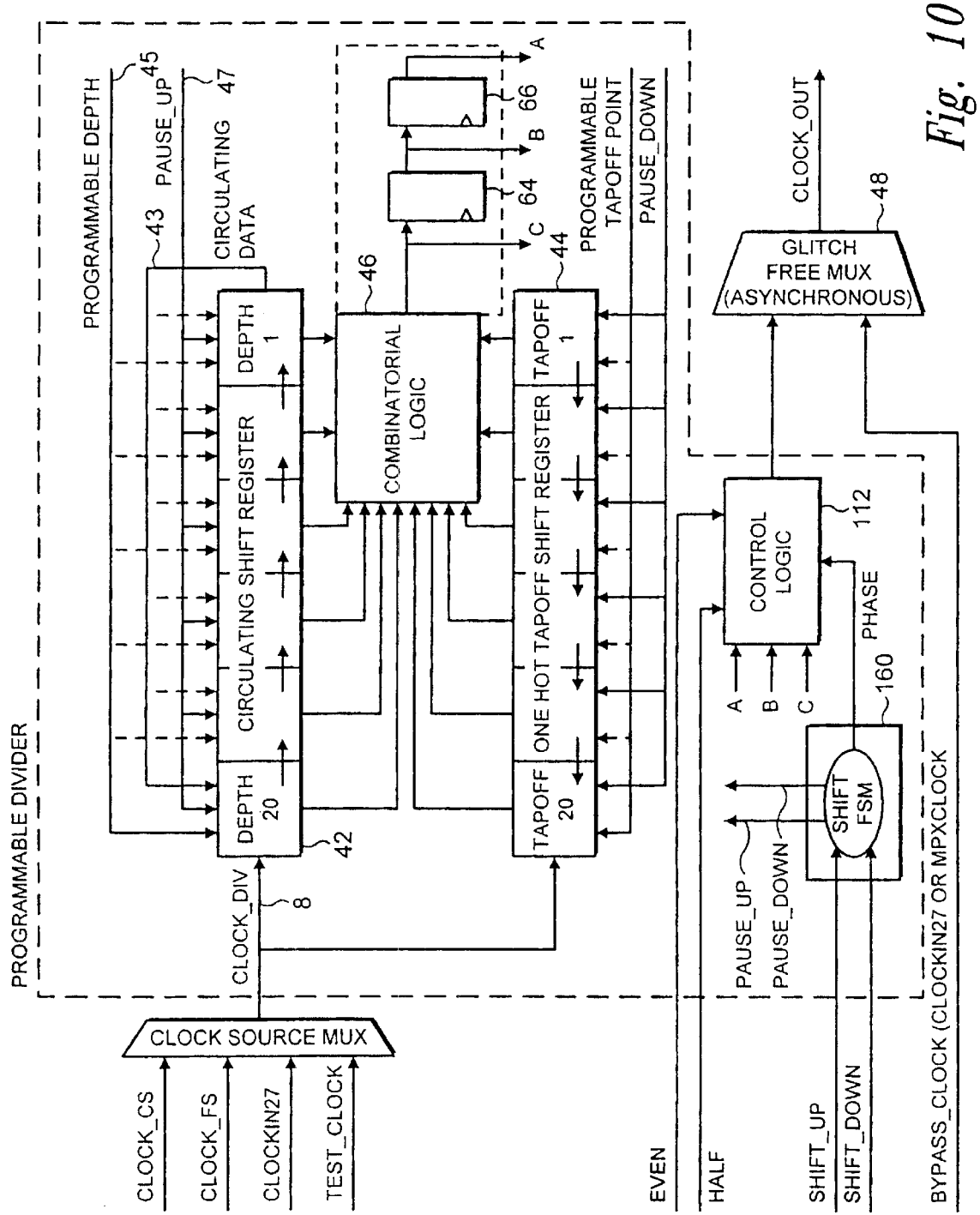
FIG. 10: shows a frequency divider with phase control embodying the invention.

An embodiment of the frequency divider providing phase control according to the invention is shown in FIG. 10. The divider comprises a circulating shift register 42 whose operation is similar to the shift register previously described. The sequence of bits in the shift register is tapped off and provided to control logic 112 which in turn provides an input to a multiplexer 48 again in a similar fashion to previously described. In addition, however, a variable tap off point on the shift register 42 is provided for coarse phase control and the control logic 46 includes additional functionality for fine phase control. The coarse control of phase will be described first.

The circulating shift register 42 is loaded with the bit sequence of 1's and 0's depending upon the divide ratio required, as previously described and the number of bits of the register or "depth" controlled by the depth line 45. In normal operation, the bit sequence is cyclical in the register on circulating line 43, under control of clock signal 8. The output from the shift register 42 can be chosen at any tap off point under control of a tap off shift register 44 and combinatorial logic 46, with a combination of temporarily stopping circulation of the register 42 and altering the effective tap off point with tap off shift register 44 and combinatorial logic 46. This allows "coarse" control by which we mean varying the output clock phase in steps of one input clock cycle.

Figure 11:
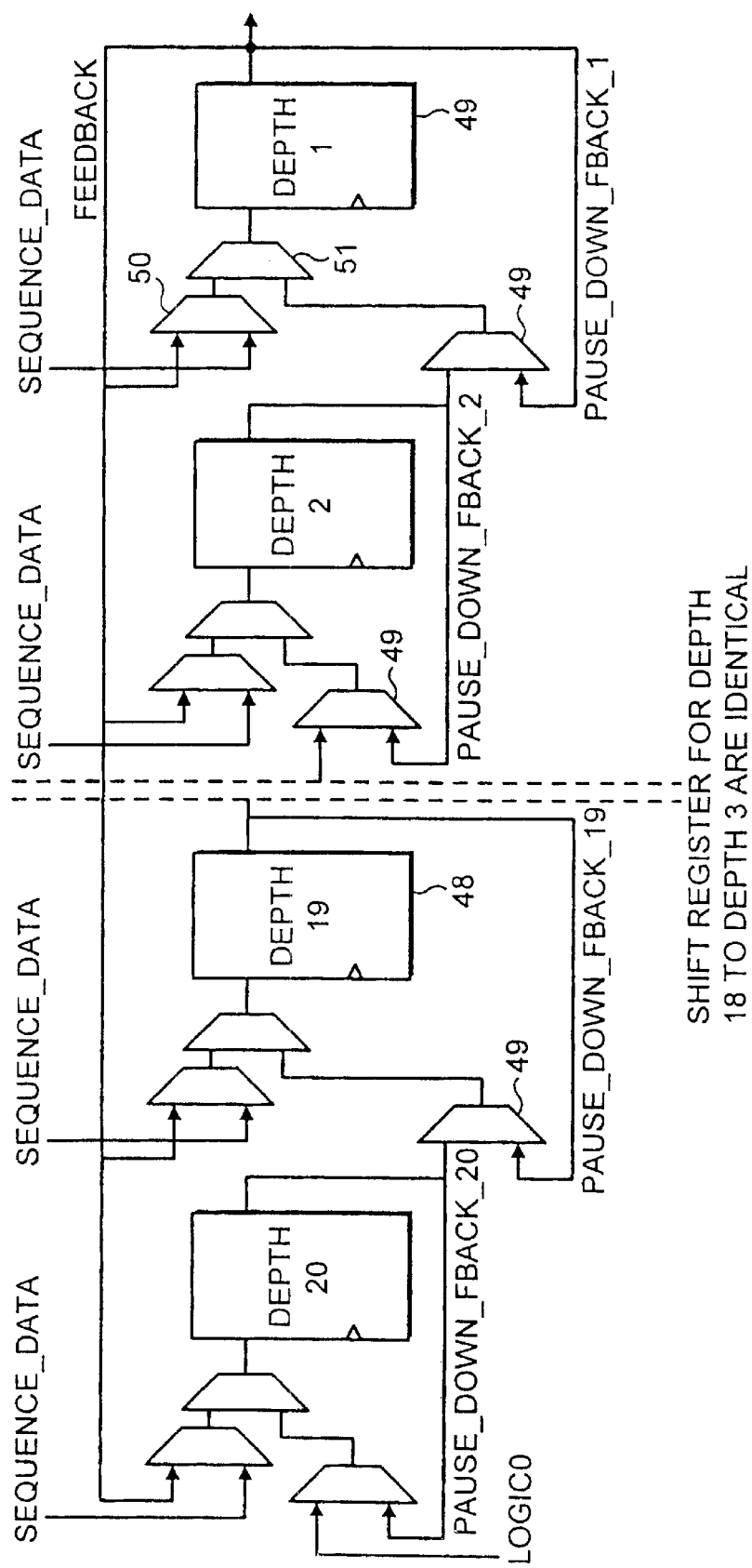
FIG. 11: shows the shift register of FIG. 10 in greater detail.

The circulating shift register 42 is shown in greater detail in FIG. 11 and comprises a series of D type flip-flops 48, each initially loaded with a 0 or 1 according to the appropriate sequence. Upon loading the last flip-flop in the sequence, the feedback signal is provided to the first flip-flop on circulating line 43. The output data from one flip-flop 48 is the source for the next flip-flop. Now each flip-flop has its input provided by a series of 3 multiplexers 49, 50, 51 which can selectively provide each D-type with an input from the previous D-type in the chain, or provide the output of the D-type to its own input. The shift register is effectively paused by sourcing each flip-flop with a feedback of its own output data. To enter this state, each multiplexer 49 at the input of each flip-flop is switched so that the output is provided to the input of each flip-flop. The normal operation of the register is to shift to the right, so a pause gives a virtual shift right of the tap point, i.e. the output is phase shifted right by one cycle of the input clock.

Figure 12:
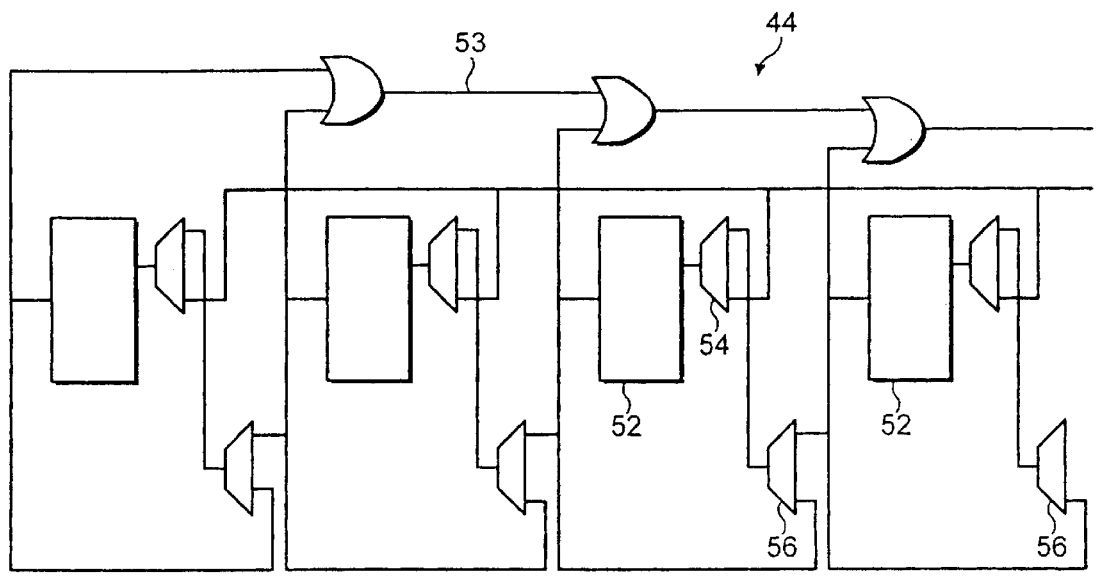
FIG. 12: shows the tap off register of FIG. 10 in greater detail.

To shift the phase left, the tap off point should be shifted left, and this is achieved by the tap off shift register 44 shown in greater detail in FIG. 12. The tap off shiftregister 44 comprises a series of D-type flip-flops 52 with inputs provided by two multiplexers 54, 56. In a similar fashion to the circulating shift register 42, the tap off shift register 44 provides the output from one D-type to the input of the next in a continuous loop including a feedback line 53. A single logic 1 bit is input to the first D-type initially, with the remaining D-types set to zero. This logic 1 is shifted through the flip-flops from output to input in turn and effectively shifts the tap off point of the circulating register to the point corresponding to the logic 1 though the combinatorial logic 46. If the tap off shiftregister 44 is paused, then the multiplexers 56 are switched so that each D-type output is provided as its own input, thereby keeping the single logic 1 at a fixed point.

Figure 13:
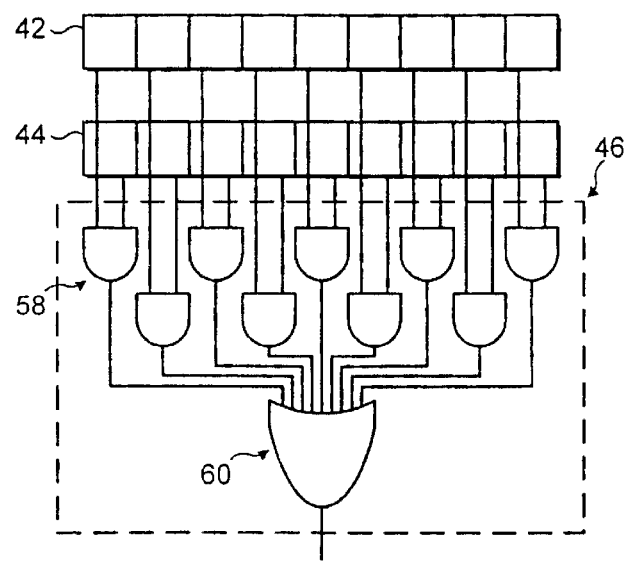
FIG. 13: shows the combinatorial logic of FIG. 10 in greater detail.

The shifting of phase is thus achieved one way by pausing the circulating shift register 42 (phase shifted right) or by allowing the tap off shift register 44 to circulate (phase shifted left). Of course, an alternative would be to shift the tap off point in either direction with a bidirectional tap off shiftregister. However, this would require more multiplexers between D-types in the register which limits clock frequency, and so is not preferred. The combinatorial logic 46 is what governs the tap off point, and this is shown in greater detail in FIG. 13. As shown, the tap off points for each D-type in the circulating and tap off shiftregisters are passed to an AND function, shown as a series of AND gates 58. The output of each AND gate will be zero except where the tap off shiftregister has a logic 1, in which case the output is the value of the corresponding bit in the circulating register. An OR function takes the output of the AND gates 58 and presents this as the output (shown as C in FIG. 10).

The moveable tap point allows for whole input clock cycle phase shifts ("coarse control") either left or right by logically moving the shift register left and right by logically or physically moving the tap point. To provide half clock cycle phase shifts ("fine" control), further circuitry is provided in the control logic 112. This is required because the shift registers 42, 44 only shift on full clock cycles of the clock signal to be divided.

Figure 14:
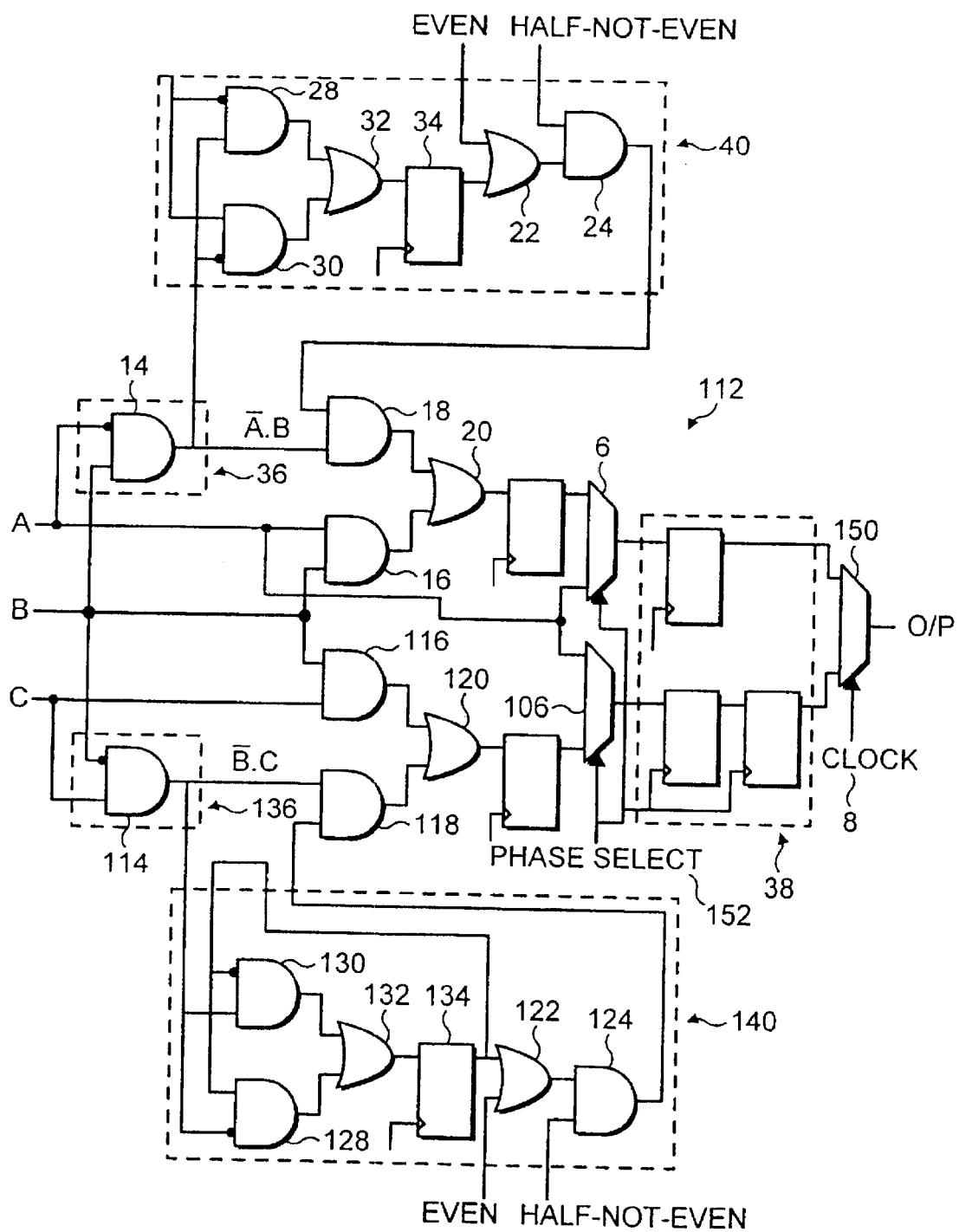
FIG. 14: shows the control logic of FIG. 10 in greater detail.

The control logic 112 is shown in greater detail in FIG. 14 and receives inputs A, B & C from the combinatorial logic 46. The input C is the direct output from the tap off point on the circulating shift register 42, whereas inputs B and A are delayed respectively by one and two clock periods by latches 64, 66. This provides outputs which are separated by clock periods as previously explained, but now there are three such outputs. The circuitry shares components in common with the circuit previously described in relation to FIG. 6. Indeed, the circuit comprises verbatim the components from FIG. 6 plus a mirror image circuit and so like components are labelled with the same numbers as before.

The operation of the top half of the circuit is exactly as previously described and so will not be repeated. The inputs A and B are treated the same as before such that the output from multiplexer 6 is broadly as before providing even, odd and half integer division. The bottom half is a mirror image of the top and provides the same functionality, wherein an edge detector 136 comprising an AND gate 114 detects a change in the bit sequence of the signals B and C from the register 42. The signal B is a delayed version of signal C and so the output of AND gate 114 ($\overline{B}.C$)=1 when the sequence is at an "edge", with B=0 and C=1. This signal provided to latch circuit 140 which operates exactly as previously described with reference to FIG. 9, such that AND gates 128, 130 and OR gate 132 provide a signal to latch 134 so that the output of the latch 134 toggles to logic 1 when an edge is detected and remains at logic 1 until the next edge is detected to provide a signal which alternates with alternate edges. This is provided to OR gate 122 and AND gate 124 which function in exactly the same way as corresponding OR gate 22 and AND gate 24.

The output from multiplexer 6 is therefore selectively either:

(1) A.B (if latch circuit 40 output=0)

(2) ($\overline{A}.B$)+(A.B)=B (if latch circuit 40 output=1); or (3) A (The state of the latch output depends on the EVEN and HALF-NOT-ODD signals and the state of the toggle circuit as previously described).

Similarly, the output from multiplexer 106 is selectively either:

(4) B.C (If latch circuit 140 output=0)

(5) ($\overline{B}.C$)+(B.C)=C (if latch circuit 140 output=1); or (6) A

Now the multiplexers 6, 106 are governed by a phase select signal 152 to select between these signals which in combination with the output multiplexer 150 which is clocked by a clock signal 8 provides the output possibilities.

If phase select high:

(7) A.B (if latch 40=0)

(8) B (if latch 40=1); or (9) A

If phase select low:

(10) A

(11) B.C (if latch 140=0); or

(12) C (if latch 140=1)

Now since A is a delayed version of B which is a delayed version of C each by one input clock period, and the output multiplexer 150 selects either the upper circuit or lower circuit every half cycle, the output is essentially phase shifted by a half cycle. This can be seen most simply for even division in which the latches 40, 140 are logical 1 so that the output multiplexer 150 alternately selects B (clock high); A (clock low) if the phase select is set high, or C (clock high); A (clock low) if the phase select is set low. As B is a delayed version of C, the output is essentially shifted.

Figure 15:
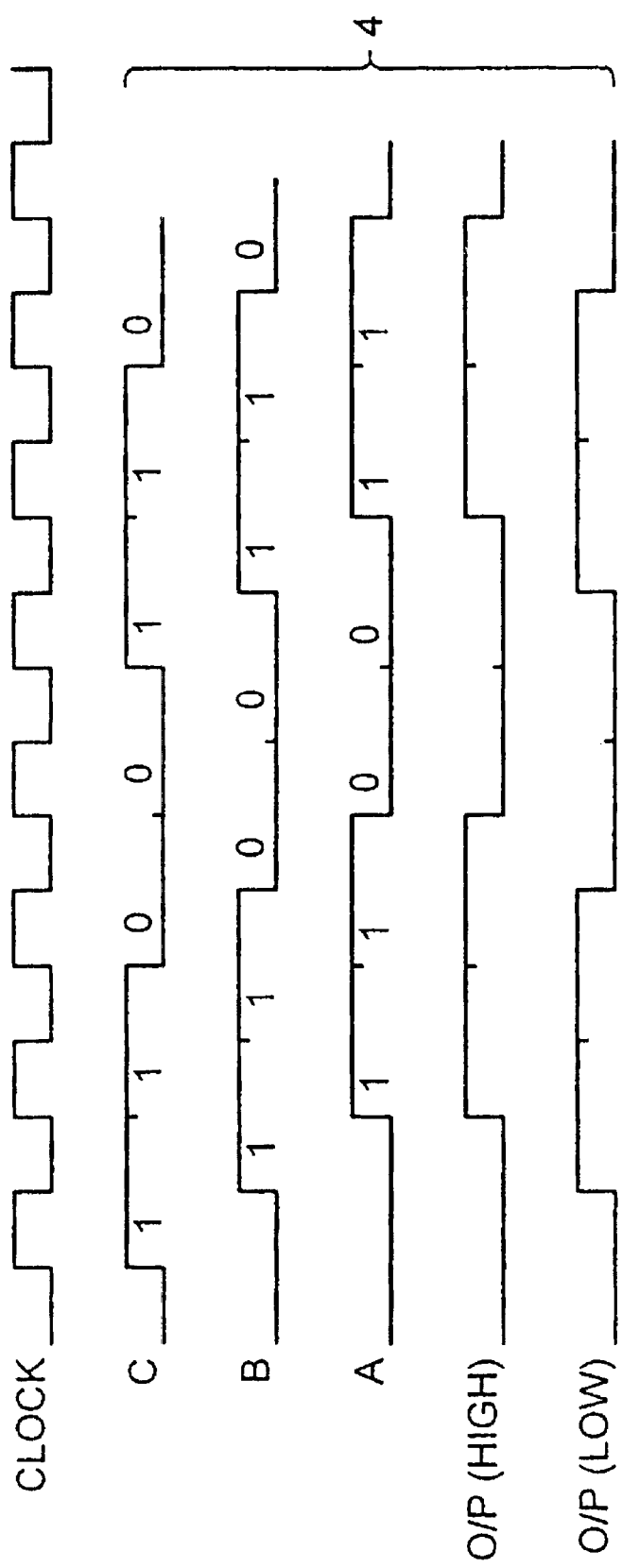
FIG. 15: shows division by 4.

This is shown in FIG. 15a, for division by 4. The inputs to the output multiplexer 150 are selected every half clock cycle and so are shown diagrammatically as shifted by one half clock cycle for ease of understanding the output signal obtained. The same principle applies for other divisions. For example, odd integer divisions would involve the output multiplexer 150 selecting A.B (clock high); A (clock low) if the phase select is set high, or B.C (clock high); A (clock low).

Now consider half integer division. In the previous non-phase shift enabled single register divider, the appropriate register sequence for division by 3½ was (1100110). Because moving the tap point effectively skips one of the bits in the sequence, the single '0' could be missed by the control logic. This would cause the control logic to miss a 0 to 1 transition, resulting in the toggle circuit output 34, 134 being the inverse of it's correct value. This in turn will result in an incorrect mark space ratio. To ensure correct operation, the bit pattern should always have at least two pairs of values i.e. 1100 and not 01011. There is thus a limitation that values of upwards of 3½ for division factor must be used.

Turning again to FIG. 10, the last component to consider is the shift FSM 160.

The shift FSM 160 is the control for shifting of the registers and changing the phase of the output clock to manage continuous half step phase changes in either direction. A number of states have to be taken into consideration. These are shifting left 170, shifting right 172, no shift 174, shifting left with phase change 178 and shifting right with phase change 176. The shifting of the clocks is caused by the assertion of shift_up (shift_left) or shift_down (shift_right) inputs. The FSM outputs pause_up which pauses the circulating shift register and pause_down which causes the one hot tap off shift register to pause. These outputs cannot be asserted at the same time.

After being in a state of shift_up or shift_down the FSM must make transition to the no_shift state in order for the output clock to settle with it's new phase sequence.

Figure 16:
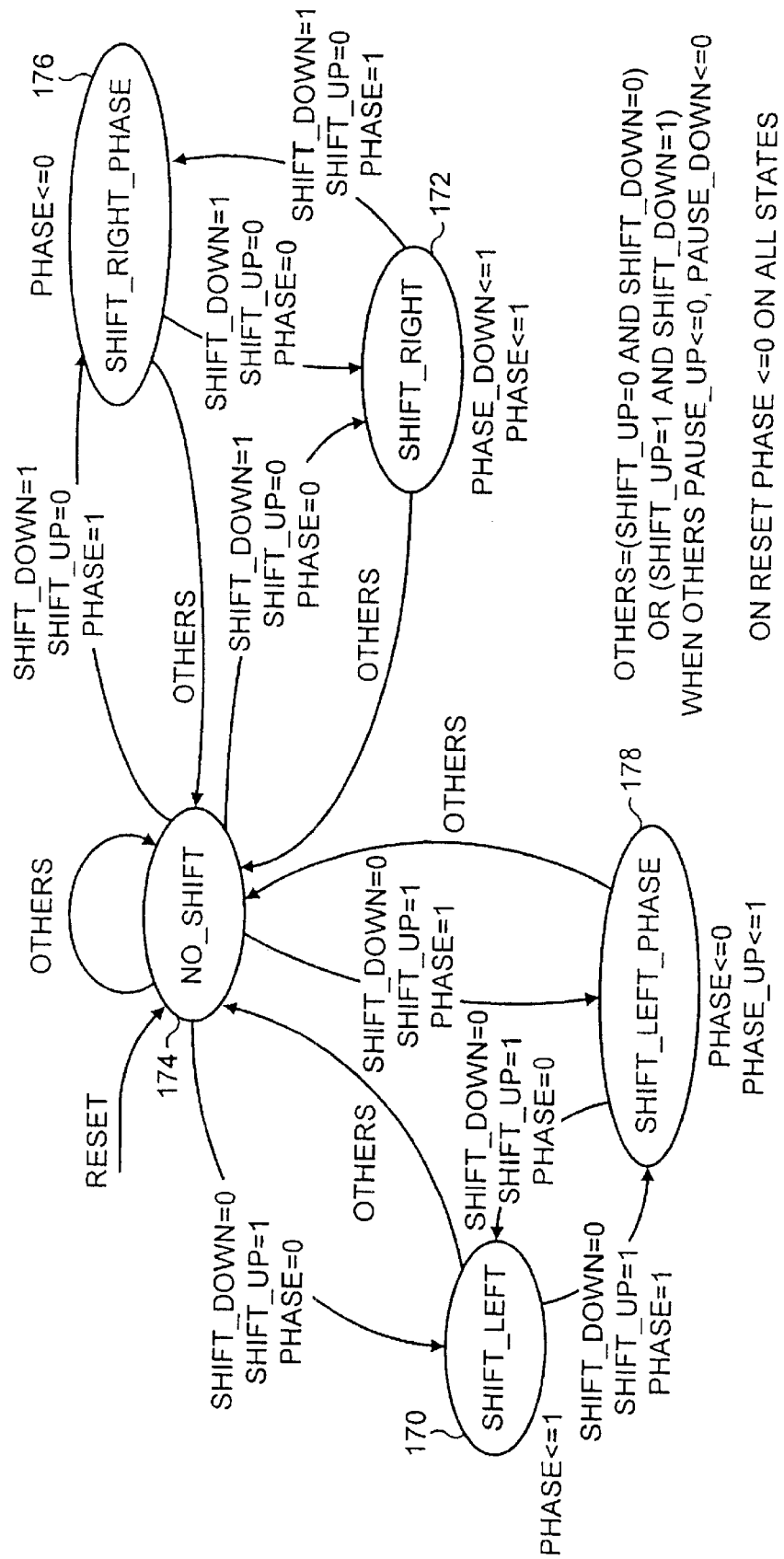
FIG. 16: shows a state diagram of the phase changes.

The phase output is a bit that toggles when in a state of shift_up or shift_down. On assertion of shift up or shift_down the phase is asserted. Therefore shifting the clocked edge up or down by half a clock period. If the shift_up or shift_down is asserted again the phase would be toggled and revert back to the original clocked edge and shift by a whole clock period. Therefore shifting the clocked edge by half a clock period. This is represented by means of a state diagram in FIG. 16.

Figure 17:
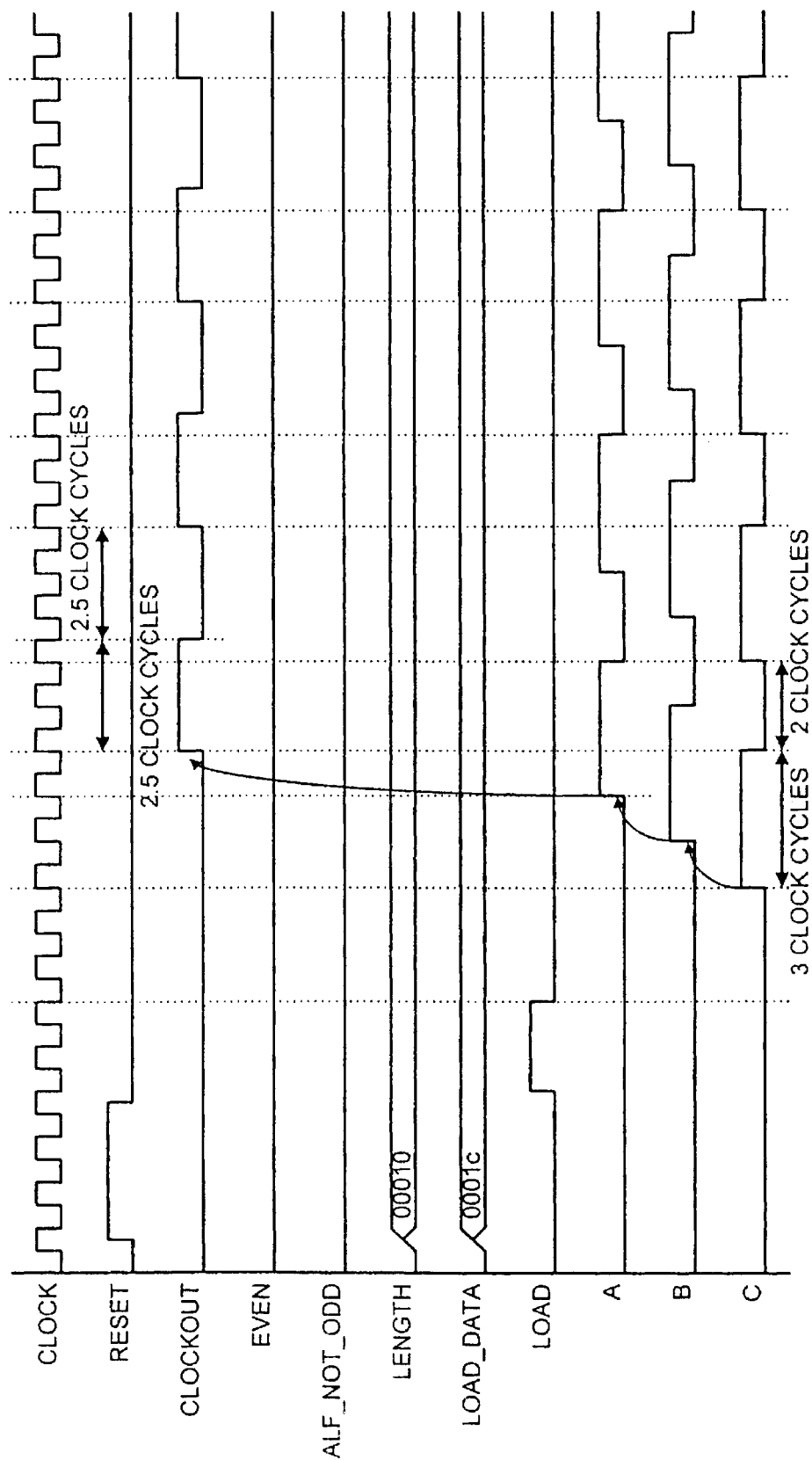
FIGS. 17 to 20: show timing diagrams for various division factors according to the invention.

FIG. 17 shows a divide by 5 simulation waveforms. There is no shift_up/down so the register is continuously circulating. Note the one clock delay between C and B and then B and A. The input sequence has a 60:40 mark space ratio and the output clock is 50:50. Also, note an odd divide ratio is first clocked off the rising edge. Note that in this diagram inputs A, B and C are correctly shown shifted by full input clock cycles, but that the outputs are selected every half clock cycle as before.

Figure 18:
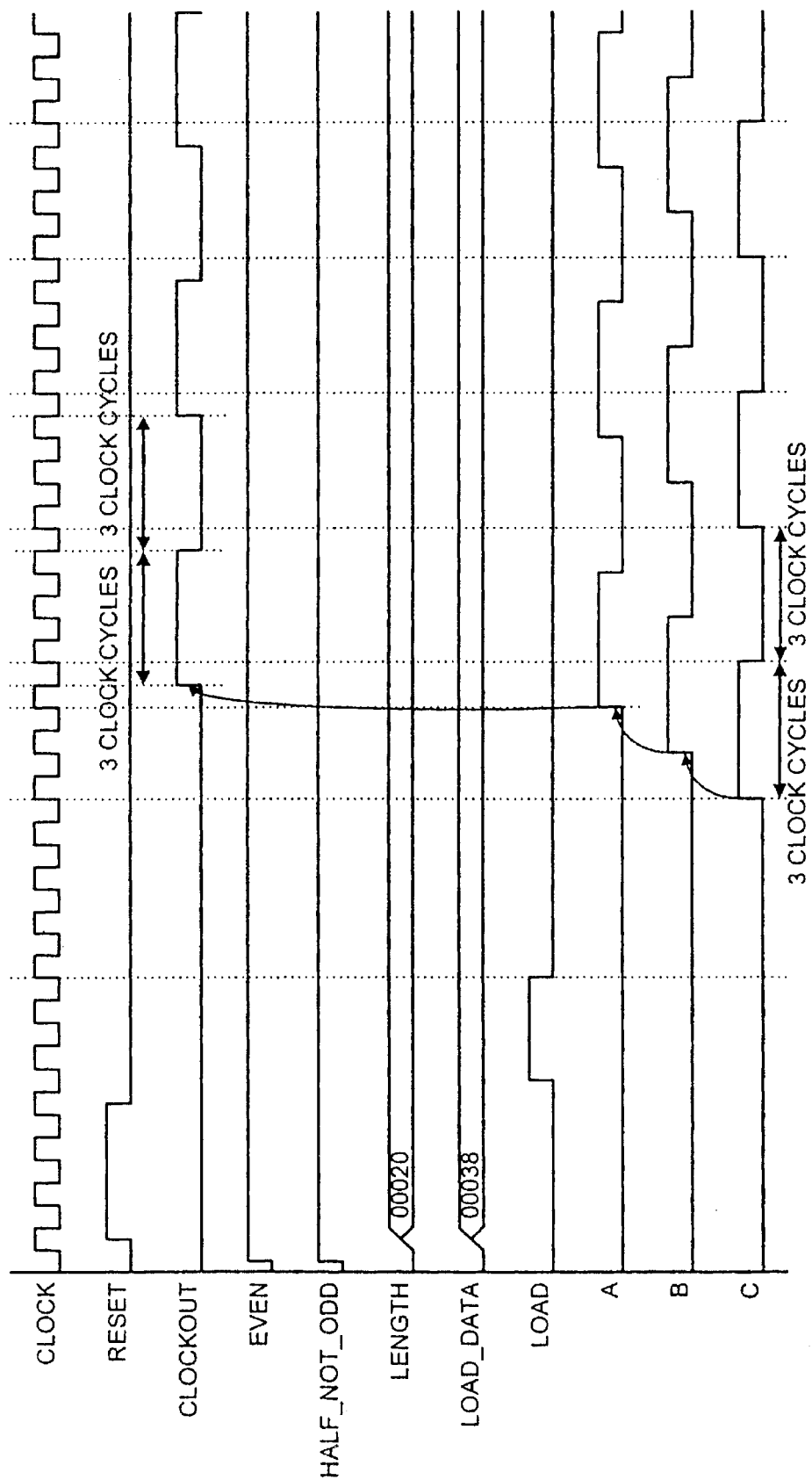

FIG. 18 shows the simulation waveforms for a divide by 6 with no shift_up/down asserted. When implementing a even divide ratio the output clock is first clocked off a falling edge. Again, the inputs A, B and C are correctly shown shifted by full clock cycles.

Figure 19:
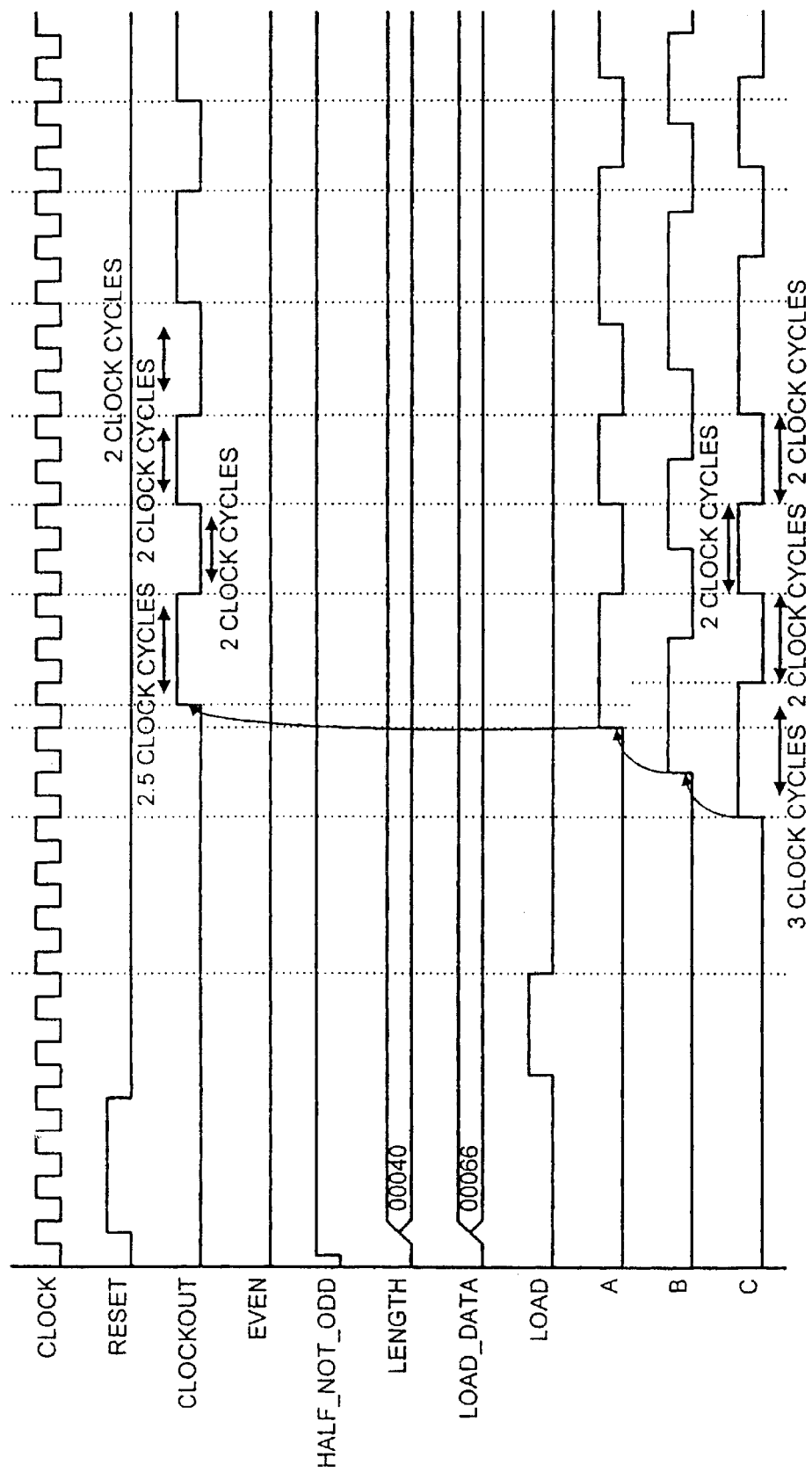

FIG. 19 shows the simulation waveforms for a divide by 4.5 with no shift_up/down asserted. When implementing a half divide the sequence is more complicated. In the case of divide by 4.5 the sequence is a divide by four followed by divide by three. The control logic achieves the 4.5 divide ratio by removing the first half clock cycle of sequence data on alternative periods of the output clock. Also the mark space ratio alternates between output clock periods.

Figure 20:
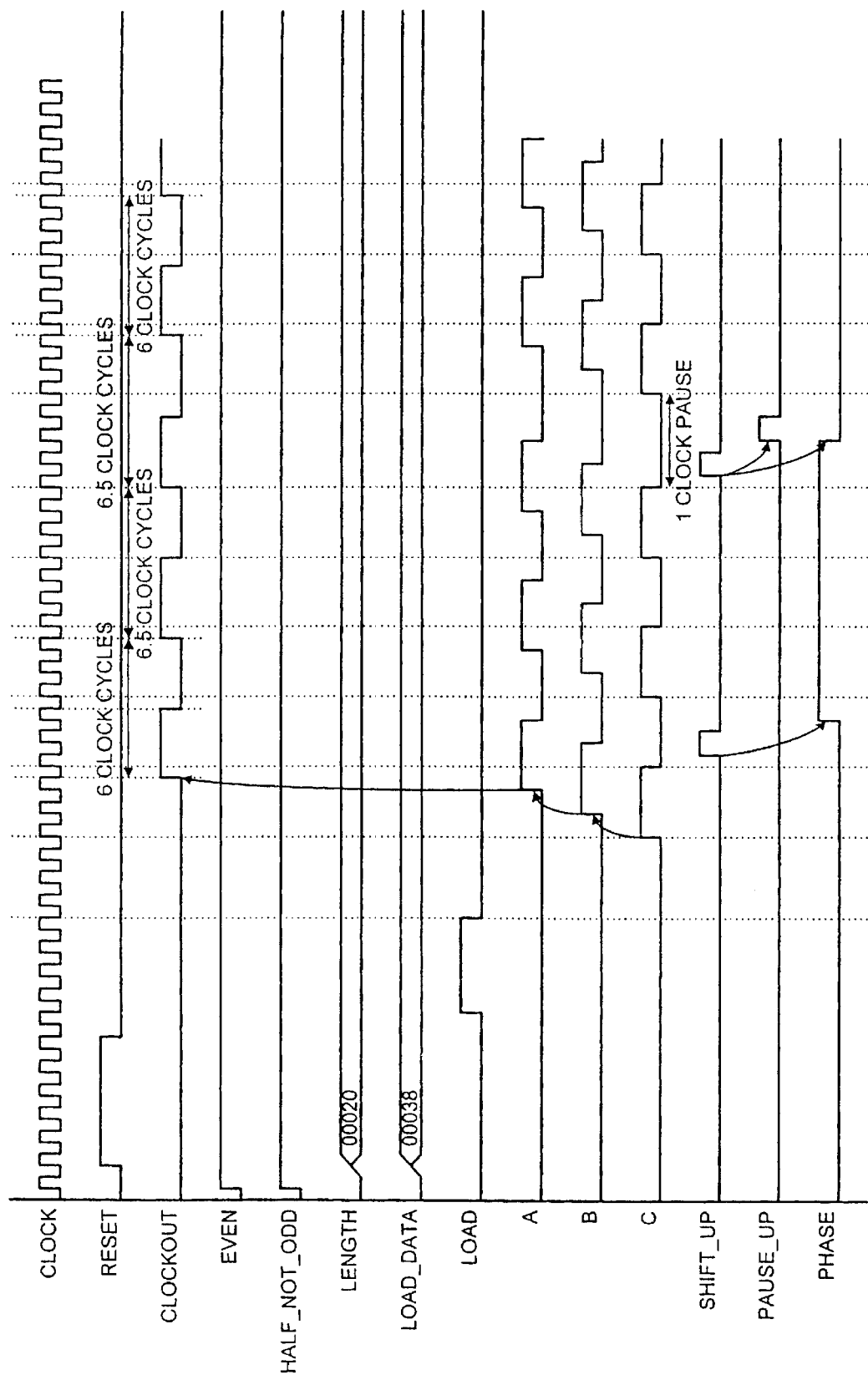

Lastly, FIG. 20 shows the simulation waveforms for a divide by 6 ratio with shift_up function. The clockout is showing a divide by 6 ratio (logic 1 for 3 clock cycles, logic 0 for 3 clock cycles) when shift up is asserted. For this condition (see state diagram, FIG. 16) the phase is asserted which causes a half clock cycle shift and the clockout signal is clocked by a positive edge. Again the shift_up is asserted before the output clock settles at 6 clock cycles and the phase is toggled. On toggling the phase the clockout is clocked by the original falling edge and the pause_up is asserted. This pauses the circulating shift register 42 which gives one clock cycle extra of sequence data in A, B and C and therefore shifting one clock period giving a half clock cycle phase shift.

The shift down functionality is similar. This asserts the phase in the same way to shift a half clock cycle and clockout is clocked off the opposite edge. If the shift_down is asserted again the phase is toggled which causes clockout to be clocked by the original edge. Then pause_down is asserted which causes the one hot tapoff shift register 44 to pause which removes one clock cycle worth of sequence data from A, B and C and therefore shifting one clock period giving a half clock cycle phase shift.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A digital frequency divider for dividing a clock frequency and having a variable phase output, comprising:

a shift register for storing a bit sequence chosen according to a division factor and operating under control of a clock signal at a first frequency;

a tap off circuit arranged to tap the shift register at one or more variable points and arranged to produce two or more signals representative of the bit sequence;

a control logic circuit having at least two inputs respectively arranged to receive the two or more signals representative of the bit sequence and arranged to provide at least two output signals; and a multiplexer arranged to receive the two output signals and to select one of the output signals under control of the clock signal at the first frequency to thereby produce a clock output signal at a second frequency being a division of the first frequency;

wherein the tap off circuit and shift register are arranged such that the one or more tap off points of the shift register are variable in position along the bit sequence such that the clock output signal is variable in phase.

2. The digital frequency divider according to claim 1, wherein the shift register is operated in a pause mode, whereby the bit sequence remains in fixed locations in the shift register thereby logically varying the one or more tap off points.

3. The digital frequency divider according to claim 1, wherein the tap off circuit comprises a tap off register with a moveable tap off bit sequence and combinatorial logic to logically tap the shift register at one or more points corresponding to logic 1 in the tap off register.

4. The digital frequency divider according to claim 3, wherein the tap off circuit includes an AND function for combining bits from the shift register with bits from the tap off register thereby logically tapping the shift register at points corresponding to logic 1 in the tap off bit sequence.

5. A digital frequency divider according to claim 3, wherein the tap off bit sequence is moveable in either direction.

6. The digital frequency divider according to claim 3, wherein the tap off bit sequence is moveable in one direction to produce a phase shift in a first direction in the output clock, and the shift register is operable in a pause mode thereby logically varying the tap off point and consequently the phase to produce a shift in a second opposite direction.

7. The digital frequency divider according to claim 1, wherein the tap off circuit includes one or more delays arranged so that the at least two signals are delayed versions of one another delayed by one or more clock periods at the first frequency.

8. The digital frequency divider according to claim 1, wherein the tap off circuit is arranged to produce three signals representative of the bit sequence, a first one of the three signals, a second one of the three signals having a delay by one clock period with respect to the first one of the three signals, and a third one of the three signals having a delay by two clock periods with respect to the first one of the three signals.

9. The digital frequency divider according to claim 8, wherein the control logic circuit has three inputs, each arranged to respectively receive the first, second and third signals representative of the bit sequence, and comprising selection circuitry arranged to produce the two output signals from the three signals representative of the bit sequence.

10. The digital frequency divider according to claim 9, wherein the selection circuitry comprises two selecting multiplexers arranged to produce the two output signals selectably providing the two output signals shifted by one half clock cycle at the first frequency.

11. The digital frequency divider according to claim 8, wherein the control logic circuit comprises first and second detectors, the first detector being configured to detect a change in the bit sequence between 0 and 1 in the first and second signals representative of the bit sequence, the second detector being configured to detect a change in the bit sequence between 0 and 1 in the second and third signals representative of the bit sequence.

12. The digital frequency divider according to claim 11, wherein each detector comprises an AND gate arranged to receive one of the three signals inverted and one of the other three signals to thereby produce a logic 1 when a change in the bit sequence between 0 and 1 is detected.

13. The digital frequency divider according to claims 11, wherein the control logic circuit is arranged to produce 1 as a first one of the outputs when a change in the bit sequence is detected for even division.

14. The digital frequency divider according to claim 11, wherein the control logic circuit is arranged to produce a 0 as a first one of the outputs when a change in the bit sequence is detected for odd division.

15. The digital frequency divider according to claims 11, wherein the control logic circuit is arranged to alternately produce a 0 then 1 as a first one of the outputs when a change in the bit sequence is detected for half integer division.

16. The digital frequency divider according to claim 11, wherein the control logic circuit includes program circuitry for indicating one of three states respectively for even, odd or half integer division.

17. The digital frequency divider according to claim 16, wherein the program circuitry provides a 1 for even division, 0 for odd division or alternately 1 and 0 for half integer division.

18. The digital frequency divider according to claim 16, wherein the program circuitry comprises an OR gate and AND gate in sequence each with one control input.

19. The digital frequency divider according to claims 16, wherein the control logic circuit includes a toggle arranged to receive a signal from the detector and to alternately produce 0 or 1 on receiving an indication of a change in the bit sequence, and to provide the alternate 0 or 1 to the control logic circuit.

20. The digital frequency divider according to claim 1, wherein the multiplexer is arranged to select a first one of the output signals when the clock signal is high and a second one of the output signals when the clock is low.

21. The digital frequency divider according to claim 1, wherein the shift register is arranged to shift in either direction and the tap off circuit is arranged to tap the shift register at one or more points.

22. A frequency divider, comprising:
a first input clock having a first frequency;
a storage register that stores a first bit sequence and having an input terminal receiving the first input clock;
a selection circuit having input, output, and control terminals, the input terminal of the selection circuit receiving the first bit sequence, and the output terminal of the selection circuit providing a second bit sequence;
a control register having input and output terminals, the input terminal of the control register receiving the first input clock, and the output terminal of the control register providing a selection status to the control terminal of the selection circuit to alter the first bits sequence, thereby selecting the second bit sequence; and
a logic circuit having first, second, and third inputs terminals and an output terminal, the first input terminal of the logic circuit receiving an operation status, the second input terminal of the logic circuit receiving a direction status, the third input terminal of the logic circuit receiving the second bit sequence, and the output terminal of the logic circuit providing a second clock having a second frequency such that the second frequency is a fraction of the first frequency of the first input clock.

23. The frequency divider according to claim 22, wherein the operation status is a signal to indicate odd, even, or half-integer division.

24. The frequency divider according to claim 22, wherein the direction status is a signal to indicate phase shift up or down.

25. The frequency divider according to claim 22, wherein the first bit sequence is a divisor bit sequence.

26. The frequency divider according to claim 22, wherein the storage register comprises a shift register.

27. The frequency divider according to claim 22, wherein the second frequency is an even, odd, or non-integer of the first frequency.

28. A method of operation of a frequency divider, the method comprising:
providing a first clock of a first frequency having a positive and negative phase;
selecting a bit sequence representative of a divisor value;
loading a first storage register with the bit sequence;
outputting the bit sequence from the first storage register at the first frequency to provide an intermediate signal having a positive and negative phase; and
altering the intermediate signal in relation to the positive or negative phase of the first clock to produce a second clock having a second frequency which is a fraction of the first frequency, wherein selecting the bit sequence includes:
   selecting a tap sequence representative of a tap off location;
   loading a second storage register with the tap sequence;
   altering the bit sequence based upon a bit value of the tap sequence; and
   outputting an altered phase of the bit sequence from the first storage register.

29. A method of operation of a frequency divider, the method comprising:
   providing a first clock of a first frequency having a positive and negative phase;
   selecting a bit sequence representative of a divisor value;
   loading a first storage register with the bit sequence;
   outputting the bit sequence from the first storage register at the first frequency to provide an intermediate signal having a positive and negative phase; and
   altering the intermediate signal in relation to the positive or negative phase of the first clock to produce a second clock having a second frequency which is a fraction of the first frequency, wherein outputting the bit sequence includes:
      outputting first, second and third bit streams;
      detecting an edge relationship between any two of the first, second or third bit streams; and
      altering the positive or negative phase of the intermediate signal to achieve a substantially 50% duty cycle on the intermediate signal, upon the event of an edge detection.

* * * * *

UNITED STATES PATENT AND TRADEMARK OFFICE
CERTIFICATE OF CORRECTION

PATENT NO. : 6,696,870 B2  Page 1 of 1
DATED : February 24, 2004
INVENTOR(S) : Andrew Dellow It is certified that error appears in the above-identified patent and that said Letters Patent is hereby corrected as shown below:

Column 11,
Line 18, "of the bit sequence," should read as -- of the bit sequence: --.
Lines 48 and 56, "according to claims 11," should read as -- according to claim 11, --.

Column 12,
Line 4, "according to claims 16," should read as -- according to claim 16, --.
Lines 34 and 35, "and third inputs terminals" should read as -- and third input terminals --.

Signed and Sealed this

First Day of June, 2004

JON W. DUDAS
*Acting Director of the United States Patent and Trademark Office*